United States Patent [19]
Sakata

[11] Patent Number: 5,678,935
[45] Date of Patent: Oct. 21, 1997

[54] SEMICONDUCTOR OPTICAL WAVEGUIDE AND METHOD OF FABRICATING THE SAME

[75] Inventor: Yasutaka Sakata, Tokyo, Japan

[73] Assignee: NEC Corporation, Tokyo, Japan

[21] Appl. No.: 625,005

[22] Filed: Mar. 29, 1996

[30] Foreign Application Priority Data

Mar. 30, 1995 [JP] Japan .................. 7-072935

[51] Int. Cl.$^6$ .................................. G02B 6/10
[52] U.S. Cl. .................. 385/131; 385/129; 385/132; 372/45; 372/50; 359/248; 257/94; 257/14
[58] Field of Search ............... 385/131, 132, 385/129; 372/44, 45, 50; 257/94, 14, 21, 436; 359/245, 248

[56] References Cited

U.S. PATENT DOCUMENTS 4,820,655  4/1989  Noda et al. .................. 385/131 X

OTHER PUBLICATIONS

"Chirp Characteristics of an 1.55 μm DFB Laser Integrated Electroabsorption Modulator", M. Aoki et al., 1993 No Month Autumn Conference C–96 of the Institute of Electronics, Information and Communication Engineers.

"Low Penalty Transmission Characteristics of Packaged DFB–LD/Modulator Integrated Light Source with Selectively Grown Window–Facet Structure Fabricated by Band-gap Energy Controlled Selective MOVPE". T. Kato et al. 1994 Vernal Congress C–226 of the Institute of Electronics, Information and Communication Engineers. No Month.

"DFB–LD/Modulator Integrated Light Source by bandgap Energy Controlled Selective MOVPE". T. Kato et al., reprinted by *Electronics Letters*, Jan. 16, 1992, vol. 28, No. 2, pp. 153–154.

"InGaAs/InGaAsP MQW Electroabsorption Modulator Integrated with a DFB Laser Fabricated by Band–Gap Energy Control Selective Area MOCVD", M. Aoki et al., *IEEE Journal of Quantum Electronics*, vol. 29, No. 6, Jun. 1993, pp. 2088–2096.

Primary Examiner—Phan T. H. Palmer
Attorney, Agent, or Firm—Sughrue, Mion, Zinn, Macpeak & Seas, PLLC

[57] ABSTRACT

On an n-InP substrate (101), a mask (102) having a first portion (102a) and a second portion (102b) is formed. The mask (102) has a first gap (NG) at the first portion (102a). A width of the second portion (102b) is greater than a width of the first portion (102a). A core layer (120) is epitaxially grown selectively on the substrate (101) at an area corresponding to the first gap (NG). The first gap (NG) is widened and an additional gap (AG) is formed at the second portion (102b) to form a second gap (WG) comprising the first gap after widened and the additional gap (AG). A clad layer (106) is epitaxially grown on the substrate (101) at an area corresponding to the second gap (WG) so as to cover the core layer (120). A difference in width between the first portion (102a) and the second portion (102b) is set so that a thickness of the clad layer at an area corresponding to the second portion (102b) becomes equal to a thickness of the clad layer (106) at an area corresponding to the first portion (102a). A structure of the semiconductor optical waveguide comprising a window structure region in which the reflection of the guided light is small is provided with good controllability and reliability and with high yield.

6 Claims, 10 Drawing Sheets

SEMICONDUCTOR OPTICAL WAVEGUIDE AND METHOD OF FABRICATING THE SAME

FIELD OF THE INVENTION

The present invention relates to a semiconductor optical waveguide and a method of fabricating the same by using a selective growth.

BACKGROUND OF THE INVENTION

A distributed feedback (DFB) laser diode integrated electro-absorption (EA) modulator is important as a light source for transmitting high speed modulated signals (for example, 2.5 to 10 gigabit/sec) over a long distance of more than 80 km. With this integrated light source, if the light is greatly reflected by the end facet of the modulator, through which end facet the light is emitted, then the fluctuation of the wavelength of the oscillated light (chirping) of the DFB laser occurs due to the effect of the reflected light to the DFB laser when the light is modulated. The chirping causes a remarkable degradation of transmission performance in the long distance transmission. Therefore, the end facet of the modulator needs to be made with a low reflection structure.

In order to achieve this low reflection structure, at the end of the modulator, a window structure in which the bandgap energy is greater than the energy of the guided light is adopted as reported by Aoki et al. in IEEE Journal of Quantum Electronics, Vol. 29, No. 6, June 1993, pp. 2088–2096.

In a DFB laser diode integrated electro-absorption modulator (first conventional device) reported by Aoki et al. in the 1993 autumn conference C-96 of the Institute of Electronics, Information and Communication Engineers, a method is adopted in which, after a multiple quantum well (MQW) waveguide layer in the window structure area is removed by etching, InP is buried for growth to realize a window structure. Hereinunder, with reference to FIGS. 1A to 1E, the first conventional device is described.

Figure 1A:
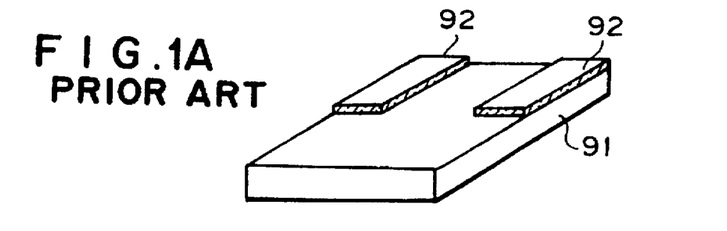
FIGS. 1A to 1E are each a process view for explaining a first conventional optical waveguide.

As shown in FIG. 1A, a pair of SiO$_2$ masks 92 having a width of several tens of μm to several hundreds of μm are formed on an n-InP substrate 91 only at the laser diode region with a gap of several tens of μm. The masks are used for blocking the epitaxial growth.

Figure 1B:
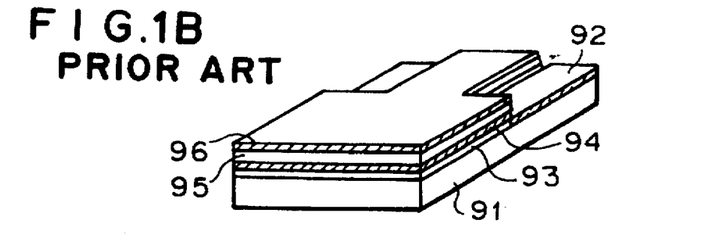

Subsequently, as shown in FIG. 1B, a light guiding layer 93, an active layer 94, a clad layer 95 and a cap layer 96 are sequentially grown according to the MOVPE selective growth process.

Figure 1C:
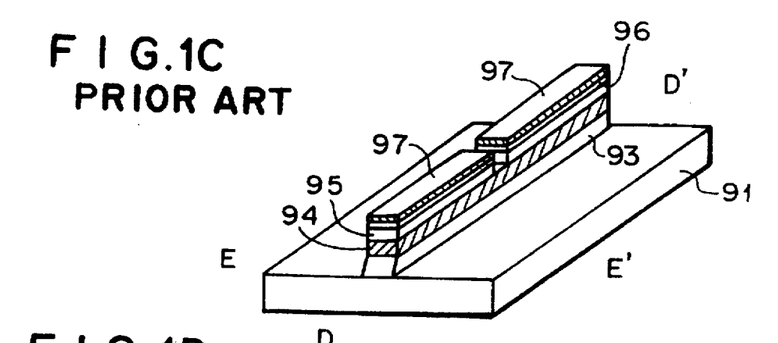

Next, as shown in FIG. 1C, SiO$_2$ masks 97 are formed and both of the laser diode region and the modulator region are mesa etched using the SiO$_2$ masks to form an optical waveguide of 1.5 to 2.0 μm wide. At this time, a portion of 40 μm length between the DFB laser diode and the EA modulator and a modulator side end portion of 20 μm length are etched.

Figure 1D:
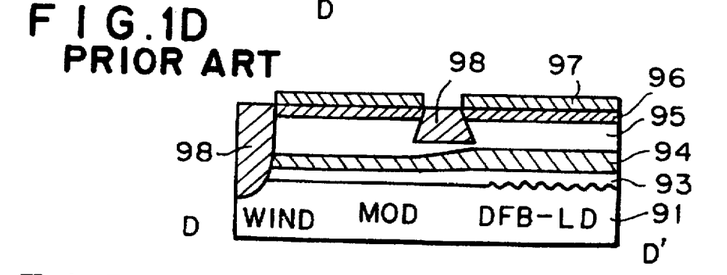
Figure 1E:
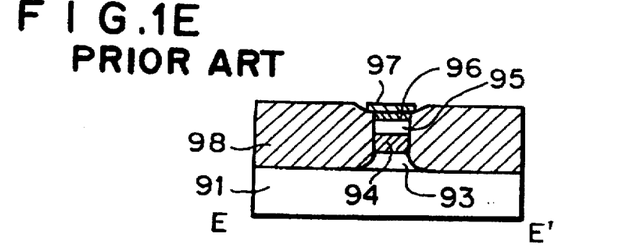

Subsequently, a Fe doped InP layer 98 which serves as a high resistance layer is grown using the SiO$_2$ masks 97 to bury the optical waveguide. FIGS. 1D and 1E each show a cross-section taken along D–D' and E–E' respectively of FIG. 1C after being buried.

In order to realize a low reflectivity at the end surface with good reliability and to maintain an excellent coupling efficiency with the optical fiber, it is necessary to strictly control the length of the window structure region. However, in the first conventional device, since the window region is formed by etching the MQW layer followed by burying or regrowth of the Fe doped InP, variance of the length of the window region is great between devices, and it is difficult to make an excellent window structure having excellent performances with good reliability and good yield.

On the other hand, a DFB laser diode/optical modulator integrated light source (second conventional device) reported by Kato et al. in the 1994 vernal congress C-226 of the Institute of Electronics, Information and Communication Engineers and by Kato et al. in Electronics Letters, 16th, Jan., 1992, Vol. 28, No. 2, pp 153–154 is fabricated by using a growth blocking mask previously formed in a region which will be made to the window structure so that no MQW structure is grown in this region. Therefore, since the length of the window structure is determined with an accuracy of the mask patterning, even if the ordinary photoresist process is used, it can be realized with an accuracy of below 1 μm. Hereinunder, with reference to FIGS. 2A to 2C and 3A to 3C, the second conventional device is described.

Figure 2A:
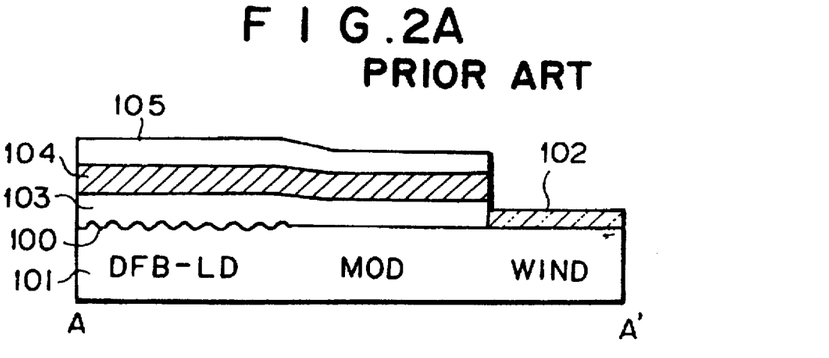
FIGS. 2A to 2C and 3A to 3C are each a process view for explaining a second conventional optical waveguide.
Figure 2B:
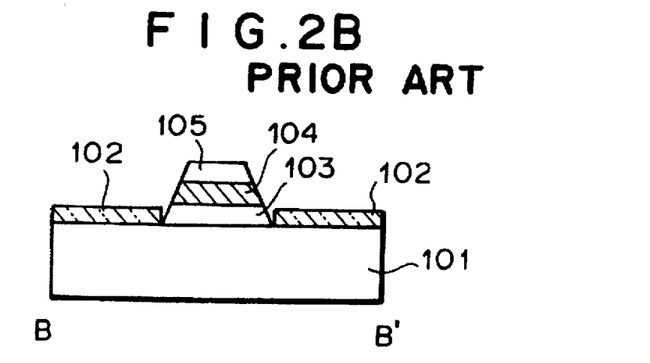
Figure 2C:
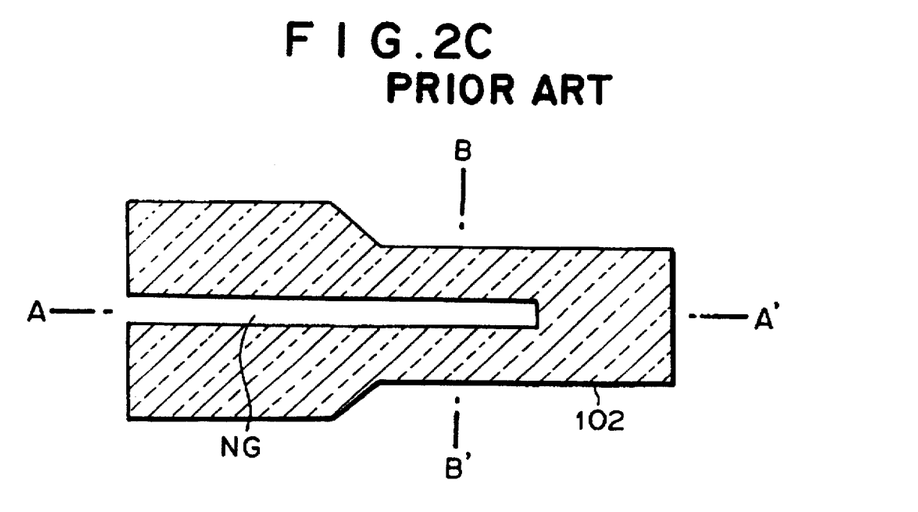

As shown in FIGS. 2A to 2C, after a diffraction grating 100 is formed on an n-InP substrate 101 at a DFB laser diode (DFB-LD) region, a SiO$_2$ mask 102 is formed. FIG. 2C is a plan view of the mask 102. FIGS. 2A and 2B each show a cross-section corresponding to a cross-section taken along A–A' and B–B' respectively of FIG. 2C. The mask width is 17 μm at the DFB-LD region and 8 μm at the modulator (MOD) region and the window (WIND) region. A gap NG having a width of 1.5 to 2.0 μm is provided at the DFB-LD region and the MOD region. Further, no gap is present at the region of 25 μm length which will be made to the WIND region. A core layer comprising InGaAsP light guiding layer 103, InGaAs/InGaAsP multiple quantum well (MQW) active layer 104 and p-InP layer 105 is formed on the susbtrate 101 at an area corresponding to the gap NG according to the MOVPE selective growth process.

Figure 3A:
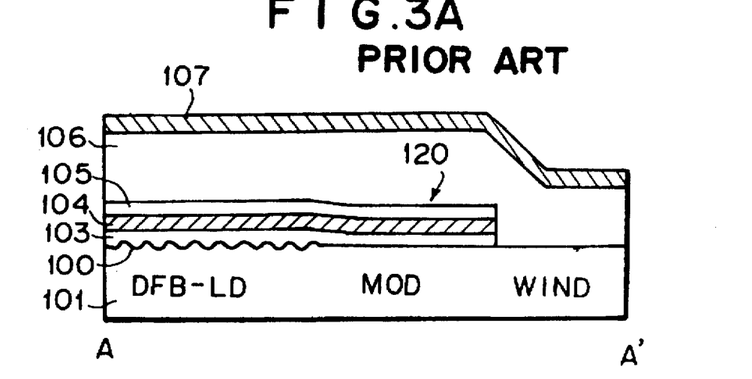
Figure 3B:
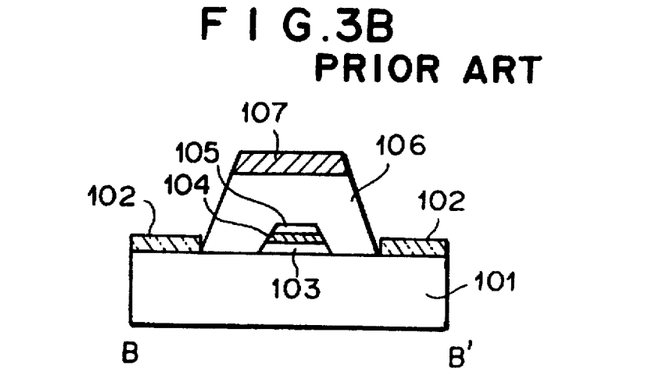
Figure 3C:
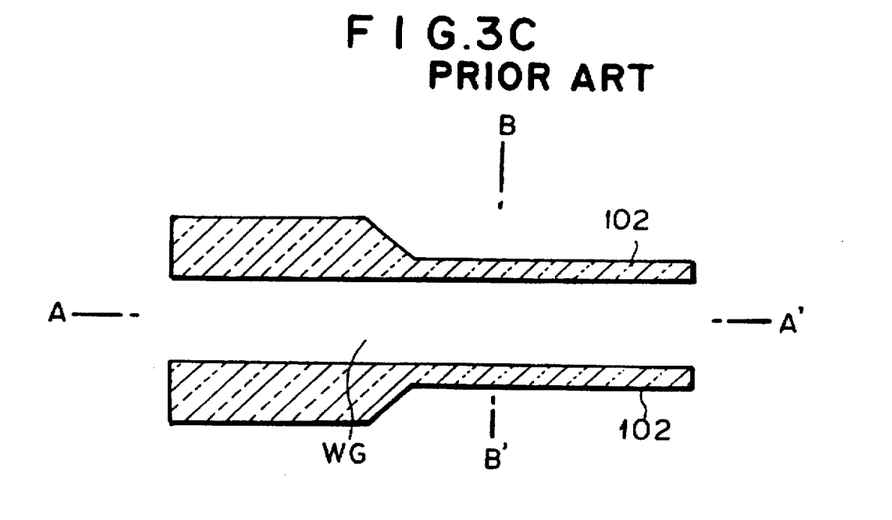

Next, as shown in FIGS. 3A to 3C, the gap WG having a width of 5 to 6 μm is formed in the mask 102 as extending through the DFB-LD, MOD and WIND regions, that is, the gap NG is widened at the DFB-LD and MOD regions and an additional gap is formed at the WIND region. FIG. 3C is a plan view of the mask 102 having the gap WG. FIGS. 3A and 3B each show a cross-section corresponding to a cross-section taken along A–A' and B–B' respectively of FIG. 3C. An p-InP clad layer 106 and p-InGaAs cap layer 107 are formed on the substrate 101 so as to cover the core layer according to the MOVPE selective growth process. Then, an electrode forming process is carried out to obtain a DFB-LD/optical modulator integrated light source.

Figure 4:
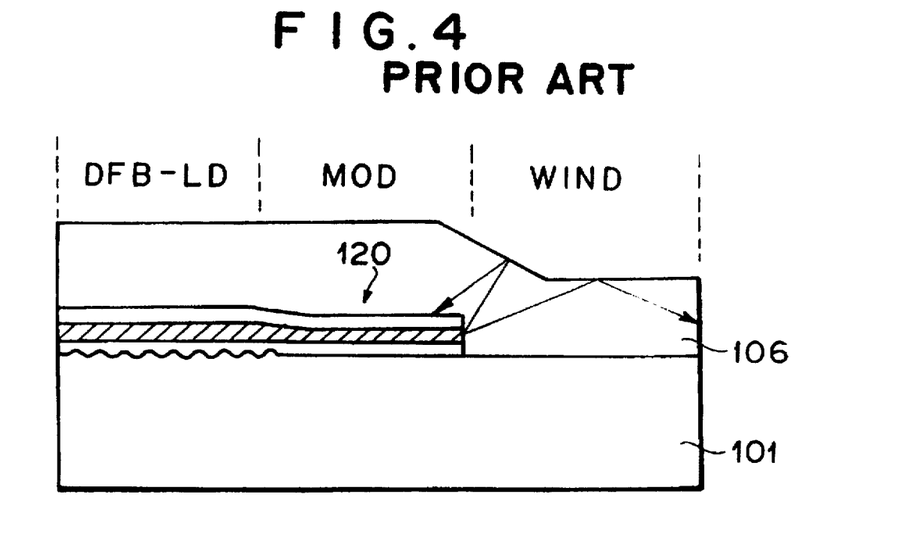
FIG. 4 is a schematic cross-sectional view of the conventional optical waveguide for explaining a reflection by a level difference portion.

In this second conventional device, since the formation of the window structure does not require the process of etching the semiconductor, it is possible to strictly control the length of the window structure region to obtain the device with good controllability and reliability and with high yield. However, as shown in the cross-sectional view of FIG. 3A, a level difference occurs on the upper surface of the p-InP clad layer 106 between the modulator region and the window region. This is because since there is no light guiding layer 103, MQW active layer 104 and p-InP layer 105 in the window region, difference in volume thereof between two regions appears itself as such. As shown in FIG. 4, if the level difference occurs on the upper surface of the clad layer 106, since part of the light is reflected by the level difference portion, the window structure does not function as the low reflection structure.

SUMMARY OF THE INVENTION

In view of the foregoing circumstances, the present invention was made, and its primary object is to provide a structure of a semiconductor optical waveguide comprising a window structure which is small in reflection of the guided light at the end portion of the modulator and a method of fabricating the same. A secondary object of the present invention is to allow such a structure to be realized with good controllability and reproducibility and good yield.

According to the present invention, there is provided a semiconductor optical waveguide, comprising:

- a semiconductor substrate;
- a window region positioned at a light emitting end;
- a non-window region positioned adjacent to the window region;
- a core layer formed on the semiconductor substrate at the non-window region; and
- a clad layer formed on the semiconductor substrate at both the window region and the non-window region, the core layer being covered with the clad layer at said non-window region,
- wherein a thickness of the clad layer at the window region is equal to or greater than a thickness of the clad layer at the non-window region.

In an embodiment of the present invention, a surface of the clad layer has no level difference between the window region and the non-window region.

In an embodiment of the present invention, the core layer comprises a light guiding layer and an active layer.

In an embodiment of the present invention, the window region is a window region of a distributed feedback laser diode integrated optical modulator.

In an embodiment of the present invention, a band gap energy of the window region is greater than a light to be guided.

According to the present invention, there is provided a method of fabricating a semiconductor optical waveguide, comprising:

- a first step of forming on a semiconductor substrate a mask having a first portion and a second portion positioned adjacent to the first portion, the mask having a first gap at the first portion, a width of the second portion being greater than a width of the first portion;
- a second step of epitaxially growing a core layer selectively on the semiconductor substrate at an area corresponding to the first gap;
- a third step of widening the first gap and forming an additional gap at the second portion to form a second gap comprising the first gap after widened and the additional gap; and
- a fourth step of epitaxially growing a clad layer selectively on the semiconductor substrate at an area corresponding to the second gap so as to cover the core layer.

In an embodiment of the present invention, a difference in width between the first portion and the second portion is set so that a thickness of the clad layer at an area corresponding to the second portion becomes equal to or greater than a thickness of the clad layer at an area corresponding to the first portion.

According to the present invention, there is provided a method of fabricating a semiconductor optical waveguide, comprising:

- a first step of forming on a semiconductor substrate a mask having a first portion and a second portion positioned adjacent to the first portion, the mask having a first gap at the first portion;
- a second step of epitaxially growing a core layer selectively on the semiconductor substrate at an area corresponding to the first gap;
- a third step of widening the first gap and forming an additional gap at the second portion to form a second gap comprising the first gap after widened and the additional gap, a width of the additional gap being narrower than that of the first gap after widened; and
- a fourth step of epitaxially growing a clad layer selectively on the semiconductor substrate at an area corresponding to the second gap so as to cover the core layer.

In an embodiment of the present invention, a difference in width between the additional gap and the first gap after widened is set so that a thickness of the clad layer at an area corresponding to the second portion becomes equal to or greater than a thickness of the clad layer at an area corresponding to the first portion.

According to the present invention, there is provided a method of fabricating a semiconductor optical waveguide, comprising:

- a first step of forming on a semiconductor substrate a mask having a first portion and a second portion positioned adjacent to the first portion, the mask having a first gap at the first portion, a width of the second portion being greater than a width of the first portion;
- a second step of epitaxially growing a core layer selectively on the semiconductor substrate at an area corresponding to the first gap;
- a third step of widening said first gap and forming an additional gap at the second portion to form a second gap comprising the first gap after widened and the additional gap, a width of the additional gap being narrower than that of the first gap after widened; and
- a fourth step of epitaxially growing a clad layer selectively on the semiconductor substrate at an area corresponding to the second gap so as to cover the core layer.

In an embodiment of the present invention, a difference in width between the first portion and the second portion and a difference in width between the additional gap and the first gap after widened are set so that a thickness of the clad layer at an area corresponding to the second portion becomes equal or greater than a thickness of the clad layer at an area corresponding to the first portion.

The present invention provides a semiconductor optical waveguide comprising a window structure for realizing the low reflection end portion, which waveguide has not such a level difference in the surface of the clad layer as increasing the reflection, by controlling the growth speed of the clad layer for each region relative to the direction of the waveguide according to the MOVPE selective growth process. Therefore, the following effects are achieved. (1) A structure of the semiconductor optical waveguide comprising a window structure in which the reflection of the guided light is small and a method of fabricating the same can be provided. (2) Such a structure can be realized with good controllability and reliability or reproducibility and with high yield.

BRIEF DESCRIPTION OF THE DRAWINGS

FIG. 6C is a plan view of a mask, and FIGS. 6A and 6B each show a cross-section corresponding to a cross-section taken along A–A' and B–B' respectively of FIG. 6C.

FIG. 7C is a plan view of a mask, and FIGS. 7A and 7B each show a cross-section corresponding to a cross-section taken along A–A' and B–B' respectively of FIG. 7C.

FIG. 11C is a plan view of a mask, and FIGS. 11A and 11B each show a cross-section corresponding to a cross-section taken along A–A' and B–B' respectively of FIG. 11C.

FIG. 12C is a plan view of a mask, and FIGS. 12A and 12B each show a cross-section corresponding to a cross-section taken along A–A' and B–B' respectively of FIG. 12C.

FIG. 13 illustrates a graph showing a relationship between the clad layer width and the level difference of the clad layer.

FIGS. 14A and 14B are a schematic plan view and cross-sectional view showing the clad layer width and the level difference respectively.

DESCRIPTION OF THE PREFERRED EMBODIMENTS

A semiconductor optical waveguide and a method of fabricating the same according to the present invention are described with reference to the accompanying drawings.

A first embodiment of the present invention is described with reference to FIGS. 5, 6A to 6C and 7A to 7C.

Figure 5:
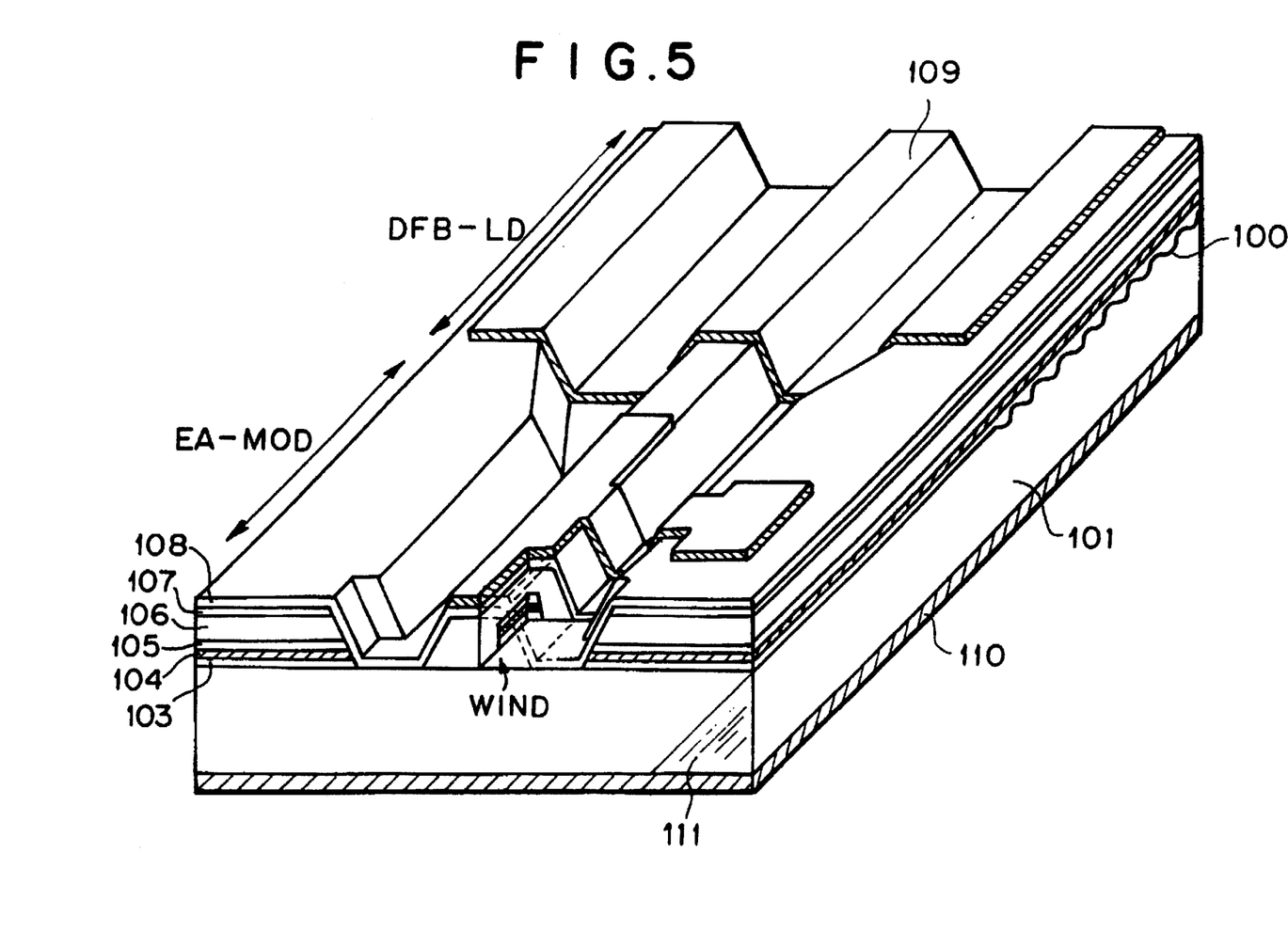
FIG. 5 is a perspective view of a structure of a DFB-LD/ electro-absorption optical modulator integrated light source having a window region.
Figure 6A:
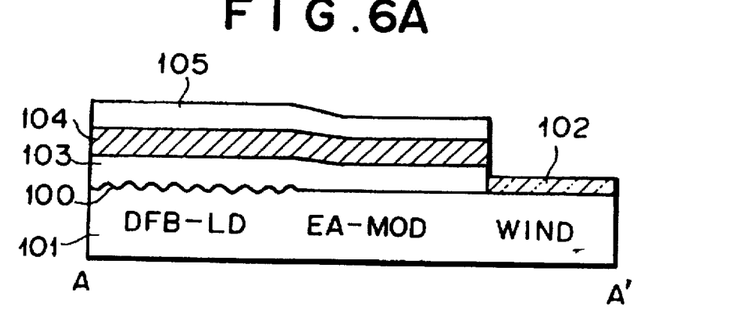
Figure 6B:
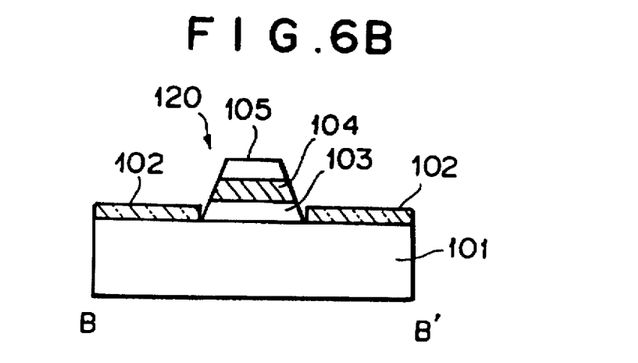
Figure 6C:
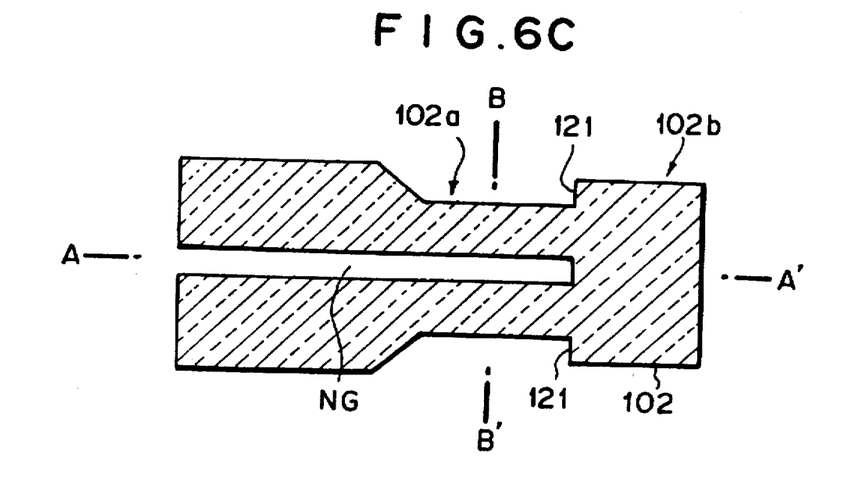

FIG. 5 is a perspective view of the structure of a DFB-LD/electro-absorption optical modulator (EA-MOD) integrated light source having a window (WIND) region. This structure including the semiconductor optical waveguide of the present invention is fabricated, for example, as follows:

First, as shown in FIGS. 6A to 6C, a diffraction grating 100 is formed on an n-InP substrate 101 at a part (DFB-LD region). Then, $SiO_2$ is deposited according to the CVD process and patterned to form a mask 102. FIG. 6C is a plan view of the mask 102. FIGS. 6A and 6B each show a cross-section corresponding to a cross-section taken along A–A' and B–B' respectively of FIG. 6C. The mask has a gap NG extending in the direction of <011> of the n-InP substrate 101 and having the width of 1.5 μm. The width of the mask 102, i.e. the length in a direction perpendicular to the direction of the gap NG, is set to 18 μm at the DFB-LD region, 6 μm at the EA-MOD region and 16 μm at the WIND region. That is, the mask 102 has two overhanging portions 121 at the WIND region, and the overhanging distance thereof is set to 5 μm (See FIG. 9A, Md=5 μm). No gap is present at the WIND region.

Next, a core layer 120 comprising an InGaAsP light guiding layer 103, InGaAsP/InGaAsP MQW active layer 104 and p-InP layer 105 is formed on the susbtrate 101 at an area corresponding to the gap NG according to the MOVPE selective growth process.

Figure 7A:
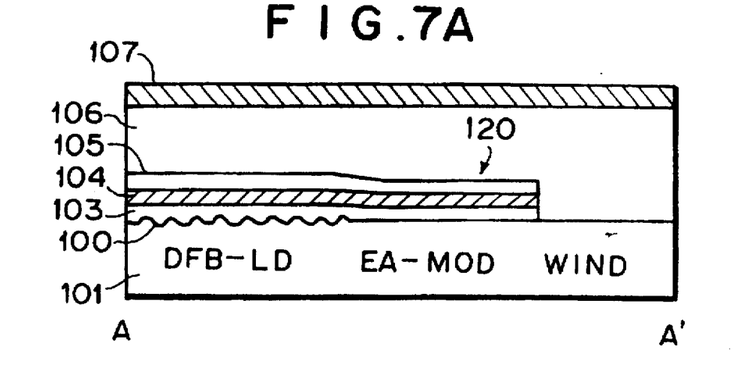
Figure 7B:
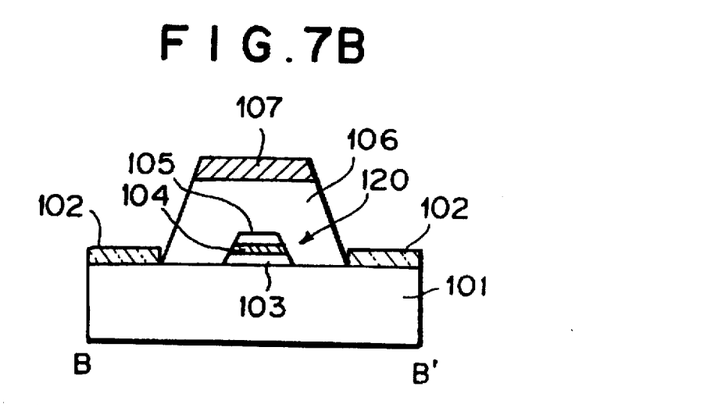
Figure 7C:
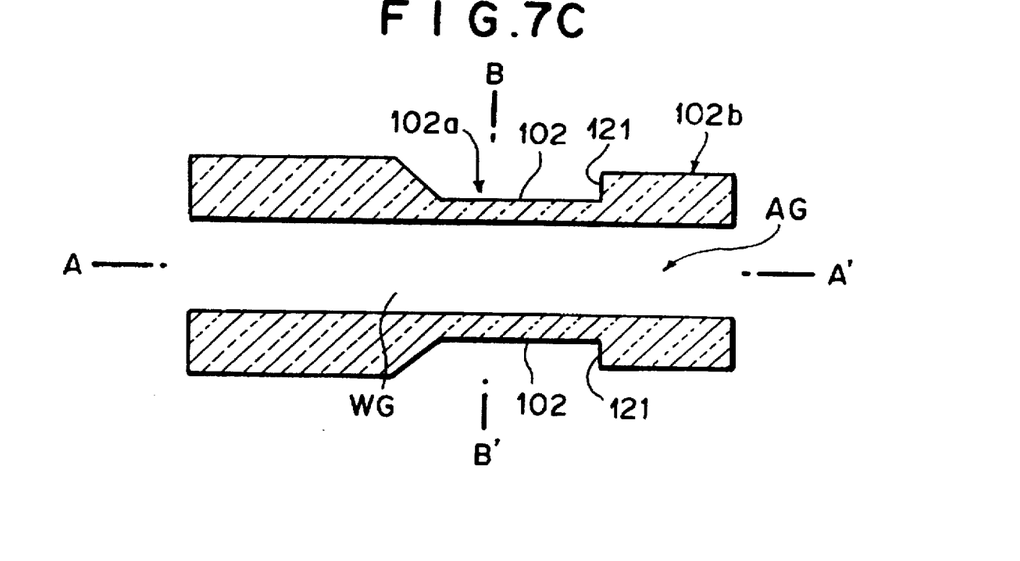

Next, as shown in FIGS. 7A to 7C, the gap WG having a width of 5 μm is formed in the mask 102 as extending through the DFB-LD, EA-MOD and WIND regions, that is, the gap NG is widened at the DFB-LD and, EA-MOD regions and an additional gap AG is formed at the WIND region. FIG. 7C is a plan view of the mask 102 having the gap WG. FIGS. 7A and 7B each show a cross-section corresponding to a cross-section taken along A–A' and B–B' respectively of FIG. 7C. A p-InP clad layer 106 and p-InGaAs cap layer 107 are formed on the substrate 101 so as to cover the core layer according to the MOVPE selective growth process. As can be seen in FIGS. 7A and 7B, there is no level difference in the upper surface of the clad layer 106. That is, a thickness of the clad layer 106 at the WIND region is equal to a thickness of the clad layer 106 at the EA-MOD region.

After the DFB-LD region and the EA-MOD region are separated by removing the p-InGaAs cap layer 107 at an area of 25 μm length between the DFB-LD region and the EA-MOD region, the electrode forming process is carried out to form an insulation film 108, a p-side electrode 109 and an n-side electrode 110. Further, a high reflectivity (70%) film is coated on the DFB-LD side end facet, and an anti-reflection (reflectivity of 1%) film 111 is coated on the WIND side end facet to obtain the DFB-LD/EA-MOD integrated light source shown in FIG. 5.

When the DFB-LD/EA-MOD integrated light source fabricated according to this embodiment was estimated, the reflectivity at the WIND region was estimated to be below 0.01%. Thus a device having the laser oscillating wavelength of 1.552 μm, the threshold current of 6 mA, the slope efficiency of 0.24 W/A and the maximum optical output of 30 mW could be realized with a yield of 90%. Further, the extinction ratio when the reverse bias voltage of 2 V was applied to the modulator was 25 dB. Further, when, with the current of 50 mA injected to the DFB laser, a pseudo random signal of 2.5 gigabit/sec was modulated by the modulator with bias voltages of 0 V and −2 V to transmit the emitted light through a 1.3 μm zero dispersion optical fiber of 120 km length, the power penalty at the bit error rate of $10^{-11}$ was below 0.1 dB.

In the above structure, no level difference of the upper surface of the p-InP clad layer 106 is present between the EA modulator region and the window structure region, and the window structure region functions as the low reflection structure. Further, this structure is realized without using the process of etching the semiconductor layer. Therefore, the process variance during etching of the semiconductor layer, which had occurred due to the difference in temperature, density or the manner of agitation of the etchant in the conventional process of making the optical waveguide having the window structure, can be suppressed to very small.

In order to realize an ideal window structure, it is necessary that the level difference of the upper surface of the p-InP clad layer is not present between the EA-MOD region and the WIND region, or that the upper level of the p-InP clad layer at the WIND region is higher than that at the EA-MOD region.

In order to make such a form, the growing speed of the p-InP clad layer at the WIND region is made greater than that at the EA-MOD region.

Figure 8:
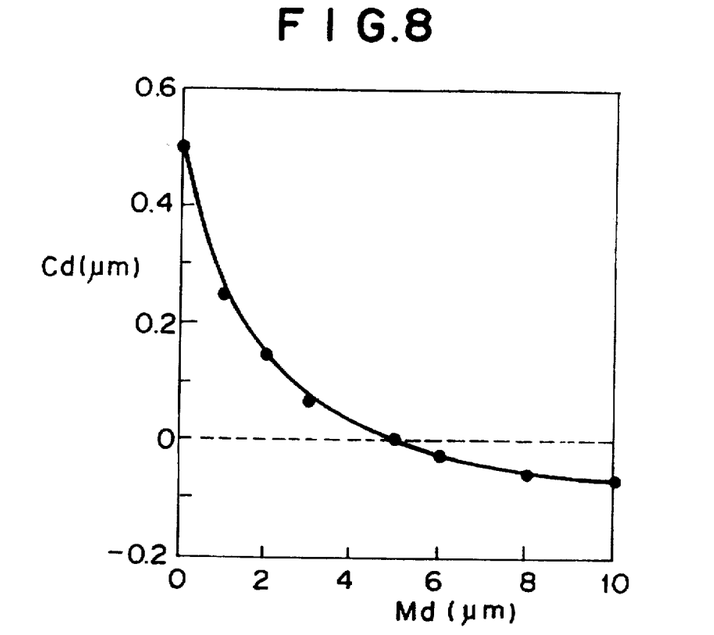
FIG. 8 illustrates a graph showing a relationship between the overhang and the level difference of the clad layer.
Figure 9A:
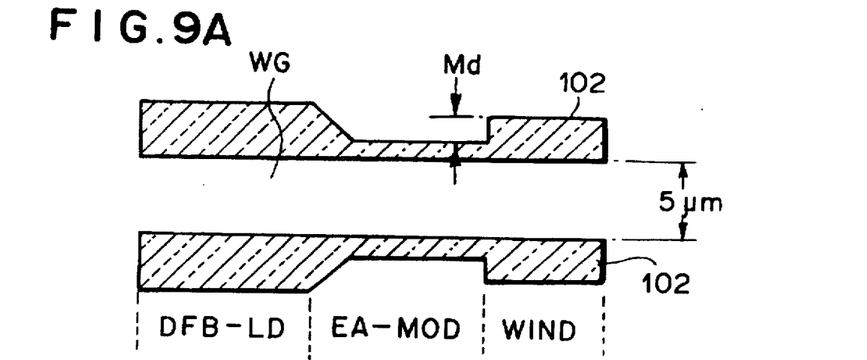
FIGS. 9A and 9B are a schematic plan view and cross-sectional view showing the overhang and the level difference respectively.
Figure 9B:
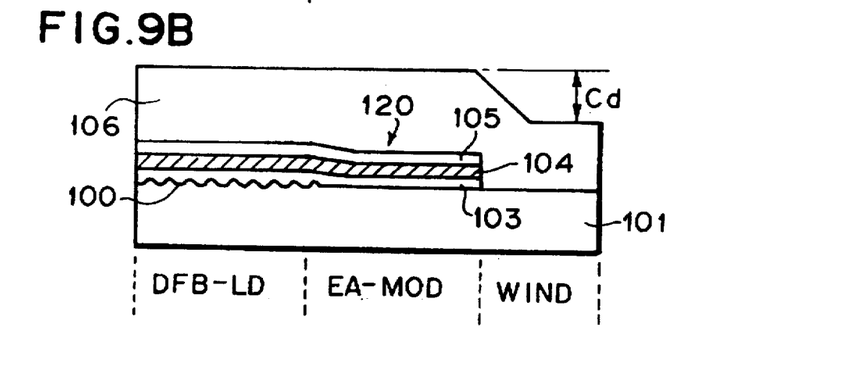

In the above first embodiment, the metal organic vapor phase epitaxy (MOVPE) process is carried out under the condition, for example, of the temperature of 625 degrees Centigrade and the pressure of 75 Torr. As the material precursors, trimethyl indium (TMIn), phosphine ($PH_3$) and diethyl zinc (DEZn) are used. FIG. 8 illustrates a graph showing the result obtained in a test when, with the width of the gap WG of the mask 102, i.e. the width of the p-InP clad layer 106, constant as 5 μm as shown in FIG. 9A, a relationship between the overhang Md shown in FIG. 9A and the level difference Cd between the upper surface of the p-InP clad layer 106 at the EA-MOD region and the upper surface of the p-InP clad layer 106 at the WIND region shown in FIG. 9B is examined. If Md=0 μm as in the second conventional device, the level difference Cd=0.5 μm occurs. If Md is increased, then Cd is monotonously decreased, and when Md=5 μm, Cd=0 μm results. If Md is made greater than 5 μm, Cd becomes negative value, which means the thickness of the p-InP clad layer 106 at the WIND region is greater than the thickness of the p-InP clad layer 106 at the EA-MOD region.

Figure 10:
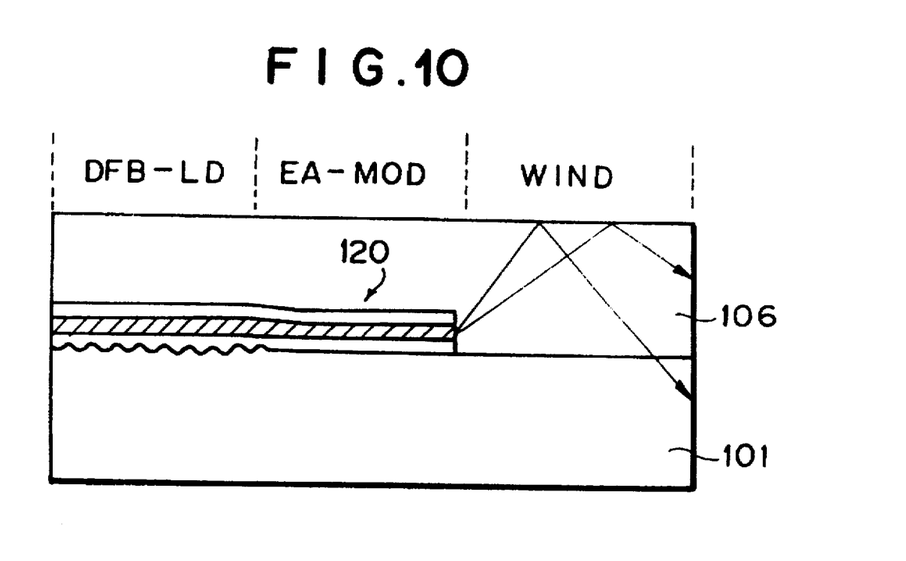
FIG. 10 is a schematic cross-sectional view of the optical waveguide of the present invention.

This can be explained on the basis of the mechanism of MOVPE selective growth process. The material precursors are consumed at the growth area while it is not consumed at the area covered with the growth blocking mask. As a result, a gradient of concentration of the material precursors in the vapor phase occurs. As a result, the material precursors diffuse in the vapor phase, and the excess material precursors are supplied from the mask area to the growth area. Therefore, the greater the mask width is, the greater the gradient of concentration becomes with the result that the supply of the material precursors is increased and the growth rate becomes greater. Therefore, if Md is set to 5 μm or more, then the level of the p-InP clad layer 106 becomes flat or higher in the window structure area and no excess reflection occurs as shown in FIG. 10.

A second embodiment of the present invention is described with reference to FIGS. 11A to 11C and 12A to 12C.

Figure 11A:
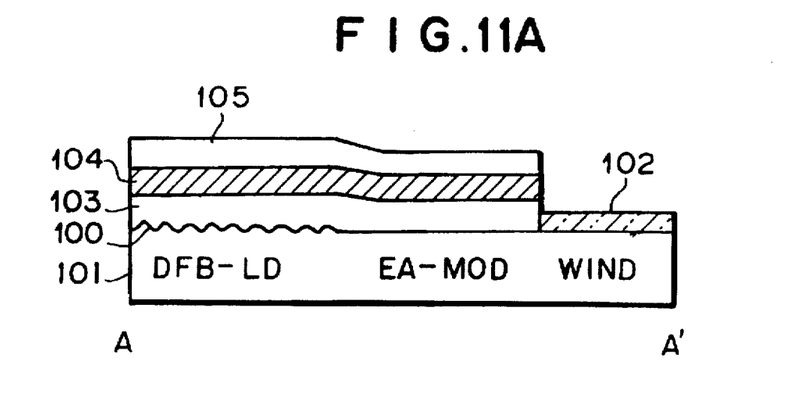
Figure 11B:
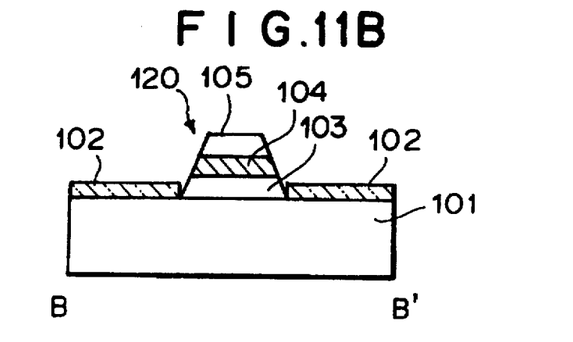
Figure 11C:
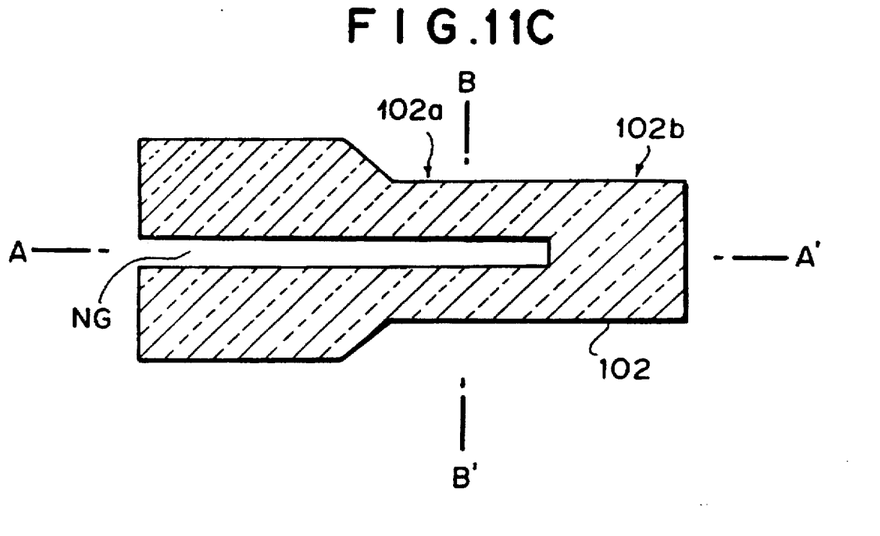

The structure of the DFB-LD/EA-MOD integrated light source having the WIND region which is analogous to the structure shown in FIG. 5 is fabricated, for example, as follows:

First, as shown in FIGS. 11A to 11C, a diffraction grating 100 is formed on an n-InP substrate 101 at a part (DFB-LD region). Then, SiO$_2$ is deposited according to the CVD process and patterned to form a mask 102. FIG. 11C is a plan view of the mask 102. FIGS. 11A and 11B each show a cross-section corresponding to a cross-section taken along A–A' and B–B' respectively of FIG. 11C. The mask has a gap NG extending in the direction of <011> of the n-InP substrate 101 and having the width of 1.5 μm. The width of the mask 102, i.e. the length in a direction perpendicular to the direction of the gap NG, is set to 18 μm at the DFB-LD region, 6 μm at the EA-MOD region and 6 μm at the WIND region. No gap is present at the WIND region.

Next, a core layer 120 comprising an InGaAsP light guiding layer 103, InGaAs/InGaAsP MQW active layer 104 and p-InP layer 105 is formed on the susbtrate 101 at an area corresponding to the gap NG according to the MOVPE selective growth process.

Figure 12A:
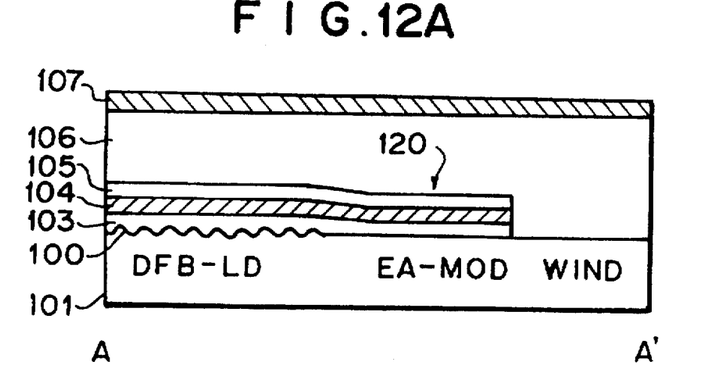
Figure 12B:
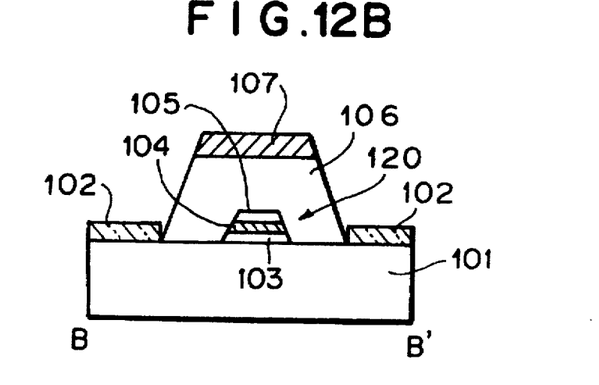
Figure 12C:
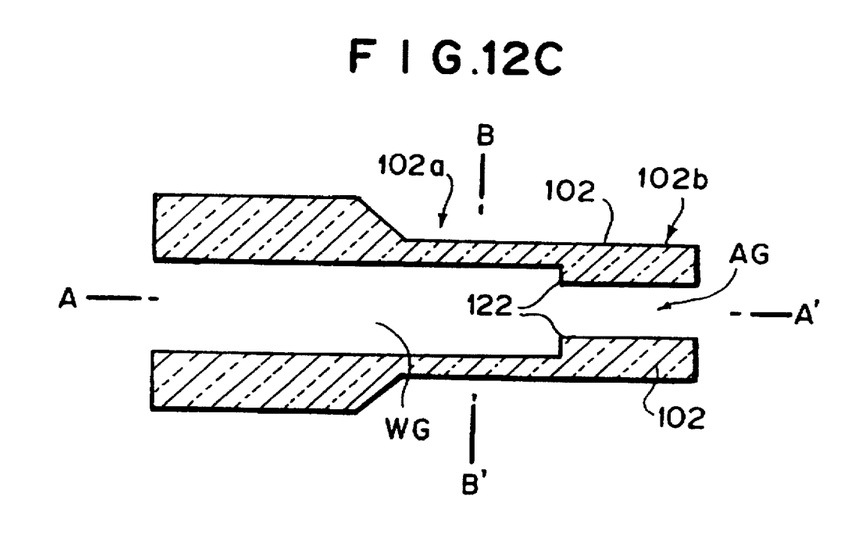

Next, as shown in FIGS. 12A to 12C, the gap WG having a width of 6 μm at the DFB-LD and EA-MOD regions and of 4 μm at the WIND region is formed in the mask 102 as extending through the DFB-LD, EA-MOD and WIND regions, that is, the gap NG is widened at the DFB-LD and EA-MOD regions and an additional gap AG is formed at the WIND region. The mask 102 has two overhanging portions 122 at the WIND region, and the overhanging distance thereof is set to 1 μm (See FIG. 14A, Wc=4 μm). FIG. 12C is a plan view of the mask 102 having the gap WG. FIGS. 12A and 12B each show a cross-section corresponding to a cross-section taken along A–A' and B–B' respectively of FIG. 12C. The p-InP clad layer 106 and p-InGaAs cap layer 107 are formed on the substrate 101 so as to cover the core layer 120 according to the MOVPE selective growth process. As can be seen in FIGS. 12A and 12B, there is no level difference in the upper surface of the clad layer 106. That is, a thickness of the clad layer 106 at the WIND region is equal to a thickness of the clad layer 106 at the EA-MOD region.

After the DFB-LD region and the EA-MOD region are separated by removing the p-InGaAs cap layer 107 at an area of 25 μm length between the DFB-LD region and the EA-MOD region, the electrode forming process is carried out. Further, a high reflectivity (70%) film is coated on the DFB-LD side end facet, and an anti-reflection (reflectivity of 1%) film is coated on the WIND side end facet to obtain the DFB-LD/EA-MOD integrated light source.

When the DFB-LD/EA-MOD integrated light source fabricated according to this embodiment was estimated, the reflectivity at the WIND region was estimated to be below 0.01%. Thus a device having the laser oscillating wavelength of 1.552 μm, the threshold current of 6 mA, the slope efficiency of 0.24 W/A and the maximum optical output of 30 mW could be realized with a yield of 88%. Further, the extinction ratio when the reverse bias voltage of 2 V was applied to the modulator was 27 dB. Further, when, with the current of 50 mA injected to the DFB laser, a pseudo random signal of 2.5 gigabit/sec was modulated by the modulator with bias voltages of 0 V and −2 V to transmit the emitted light through a 1.3 μm zero dispersion optical fiber of 120 km length, the power penalty at the bit error rate of $10^{-11}$ was below 0.1 dB.

In the above structure, no level difference of the upper surface of the p-InP clad layer 106 is present between the EA modulator region and the window structure region, and the window structure region functions as the low reflection structure. Further, this structure is realized without using the process of etching the semiconductor layer. Therefore, the process variance during etching of the semiconductor layer, which had occurred due to the difference in temperature, density or the manner of agitation of the etchant in the conventional process of making the optical waveguide having the window structure, can be suppressed to very small.

In the above second embodiment, the metal organic vapor phase epitaxy (MOVPE) process is carried out under substantially the same condition as in the first embodiment. FIG. 13 illustrates a graph showing the result obtained in a test when, with the width of the gap WG of the mask 102, i.e. the width of the p-InP clad layer 106, at the DFB-LD and EA-MOD region constant as 6 μm as shown in FIG. 14A, a relationship between the clad layer width Wc shown in FIG. 14A and the level difference Cd between the upper surface of the p-InP clad layer 106 at the EA-MOD region and the upper surface of the p-InP clad layer 106 at the WIND region shown in FIG. 14B is examined. If Wc=6 μm as in the second conventional device, the level difference Cd=0.5 μm occurs. If Wc is decreased, then Cd is monotonously decreased, and when Wc=4 μm, Cd=0 μm results. If Wc is made smaller than 4 μm, Cd becomes negative value, which means the thickness of the p-InP clad layer 106 at the WIND region is greater than the thickness of the p-InP clad layer 106 at the EA-MOD region.

This is because, when the same amount of material species are supplied, if the growth width of the p-InP clad layer 106 is made narrower, the growth rate taken in the longitudinal direction, i.e. the normal direction of the substrate, becomes greater in order to achieve the growth corresponding to the same volume. Therefore, if Wc is set to 4 μm or below, then the level of the p-InP clad layer 106 becomes flat or higher in the window structure area and no excess reflection occurs as shown in FIG. 10.

It should be noted that the mask 102 having the overhanging portions 121 shown in FIGS. 6C and 7C and having the overhanging portions 122 shown in FIG. 12C may be used to fabricate the device according to the present invention.

Although, in the foregoing embodiments, only the InGaAsP type device of 1.5 μm order wavelength was described, any structure similar to the above embodiments can be realized as long as the MOVPE selective growth can be applicable. Further, although, in the foregoing embodiments, description was made only as to the application to the DFB-LD/EA-MOD integrated light source, the present invention cannot only be applied to the DFB-LD/EA-MOD integrated light source, but also to other devices requiring the optical waveguide structure comprising the window structure.

What is claimed is:

1. A semiconductor optical waveguide, comprising:

a semiconductor substrate;

a window region positioned at a light emitting end;

a non-window region positioned adjacent to said window region;

a core layer formed on said semiconductor substrate at said non-window region but not formed at said window region;

a clad layer formed on said semiconductor substrate at both said window region and said non-window region, said core layer being covered with said clad layer at said non-window region, wherein a thickness of said clad layer at said window region is equal to or greater than a thickness of said clad layer at said non-window region.

2. A semiconductor optical waveguide as set forth in claim 1, wherein a surface of said clad layer has no level difference between said window region and said non-window region.

3. A semiconductor optical waveguide as set forth in claim 1, wherein said core layer comprises a light guiding layer and an active layer.

4. A semiconductor optical waveguide as set forth in claim 1, wherein said window region is a window region of a distributed feed-back laser diode integrated optical modulator.

5. A semiconductor optical waveguide as set forth in claim 1, wherein a band gap energy of said window region is greater than a light to be guided.

6. The semiconductor optical waveguide as set forth in claim 1, wherein said core layer is formed on said semiconductor substrate at only said non-window region.

* * * * *